«12» United States Patent
Tsai et al.

(10) Patent No.: US 9,781,827 B2
(45) Date of Patent: Oct. 3, 2017

(54) PERIPHERAL DEVICE

(71) Applicants: DARFON ELECTRONICS (SUZHOU) CO., LTD., Suzhou, Jiangsu (CN); Darfon Electronics Corp., Taoyuan (TW)

(72) Inventors: Po-Wei Tsai, Tainan (TW); Ching-Yu Wang, Taoyuan (TW)

(73) Assignees: DARFON ELECTRONICS (SUZHOU) CO., LTD., Suzhou (CN); Darfon Electronics Corp., Taoyuan (TW)

( * ) Notice: Subject to any disclaimer, the term of this patent is extended or adjusted under 35 U.S.C. 154(b) by 42 days.

(21) Appl. No.: 15/153,686

(22) Filed: May 12, 2016

(65) Prior Publication Data

US 2016/0374224 A1    Dec. 22, 2016

(30) Foreign Application Priority Data

Jun. 18, 2015    (TW) .............................. 104119848 A (51) Int. Cl.
  *H05K 1/00*    (2006.01)
  *H05K 1/02*    (2006.01)
  *H01H 13/70*   (2006.01)

(52) U.S. Cl.
  CPC .............. *H05K 1/028* (2013.01); *H01H 13/70* (2013.01); *H05K 2201/09145* (2013.01)

(58) Field of Classification Search
  CPC ..................... H01H 13/70; H05K 2201/09145
  USPC .......................................... 174/254; 361/749
  See application file for complete search history.

(56) References Cited

U.S. PATENT DOCUMENTS

| 6,118,665 | A | * | 9/2000 | Kishida | ................. | H05K 3/361 |
| | | | | | | 174/117 F |
| 7,710,740 | B2 | * | 5/2010 | Liu | ........................ | H05K 1/147 |
| | | | | | | 361/748 |
| 2002/0050399 | A1 | | 5/2002 | Yang et al. | | |
| 2009/0103275 | A1 | | 4/2009 | Liu | | |
| 2011/0132642 | A1 | * | 6/2011 | Shinoda | ................. | H05K 1/028 |
| | | | | | | 174/254 |

FOREIGN PATENT DOCUMENTS

| JP | 2002-141632 | 5/2002 |
| TW | 553582 | 9/2003 |
| TW | M327618 | 2/2008 |

* cited by examiner

*Primary Examiner* — Sherman Ng
(74) *Attorney, Agent, or Firm* — Chich-Mei Wang (57) ABSTRACT

A peripheral device includes a manual operable device, a baseplate for carrying the manual operable device and a circuit board. The baseplate includes a plate edge extending substantially along an x-axis; a left plate indent edge, a left convex edge, a substantially linear edge, a right convex edge and a right plate indent edge are sequentially disposed on the plate edge. The circuit board includes a main portion and a flexible extension. The main portion generates a control signal in response to a triggering event at the manual operable device. The flexible extension extends substantially along a y-axis, and includes an upper end, a lower end, a y-axial left edge and a y-axial right edge; the upper end is connected to the main portion, the lower end is connected to an external connection point, and the control signal is transmitted to the external connection point via the flexible extension.

18 Claims, 8 Drawing Sheets

PERIPHERAL DEVICE

FIELD OF THE INVENTION

The present invention relates to an electronic device, and more particularly to a peripheral device.

BACKGROUND OF THE INVENTION

Advancements in information technology have simplified peoples' everyday lives and led to the popularization of tablet computers, smart phones, and laptops. Such electronic products are built-in with peripheral devices, such as touch-screen display, keyboard, and touch panel, for users to enter instructions. These peripheral devices are generally modularized to facilitate assembly and disassembly and utilize flexible circuit boards to electrically connect to connectors within the electronic products, so that data signals input by the users from the peripheral devices are transmitted by the flexible circuit boards to the electronic products.

Figure 1:
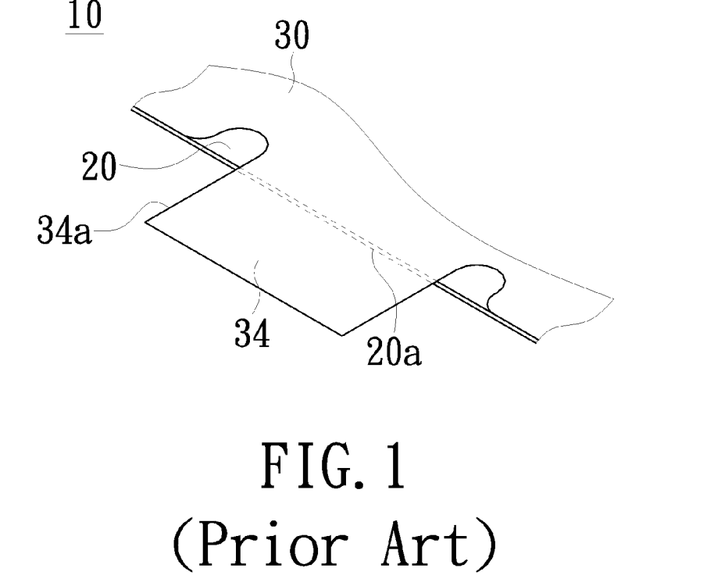
FIG. 1 is a schematic perspective view of a peripheral device according to the prior art.
Figure 2:
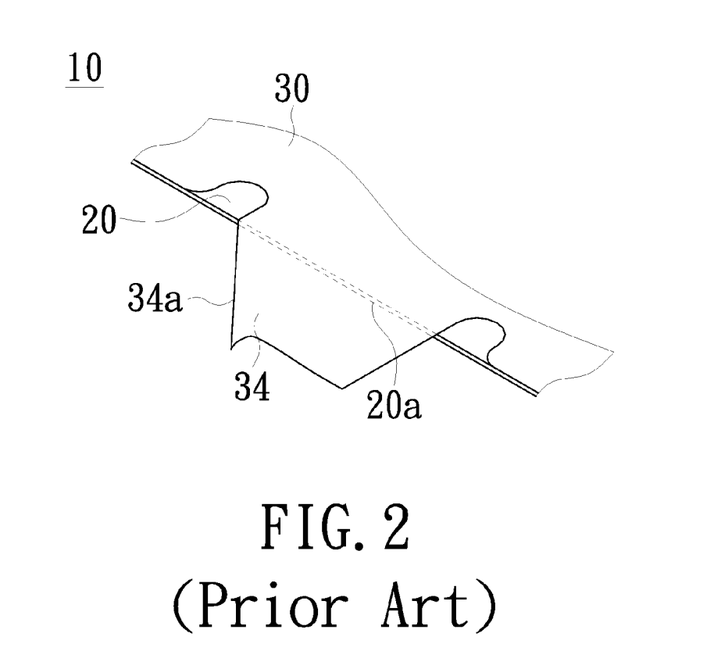
FIG. 2 is a schematic perspective view of the peripheral device of FIG. 1 being bent when an external force is applied.

Referring to FIGS. 1 and 2. FIG. 1 illustrates a perspective view of a peripheral device according to the prior art, and FIG. 2 illustrates bending of the peripheral device of FIG. 1 when an external force is applied. As shown in FIGS. 1 and 2, circuit board 30 of peripheral device 10 includes a flexible extension 34, and baseplate 20 for carrying the circuit board 30 includes an edge 20a. Side 34a of the flexible extension 34 is perpendicular to the edge 20a of the baseplate 20. When the flexible extension 34 of the circuit board 30 is bent and stretched by an external force, stress would be concentrated at the intersection between side 34a of the flexible extension 34 and edge 20a of the baseplate 20, causing the sharp edge 20a to cut and damage the flexible extension 34, break the internal wiring of the circuit board 30, and therefore malfunction in electrical conduction or signal transmission of the peripheral device 10.

BRIEF SUMMARY OF THE INVENTION

The present invention provides a peripheral device free from cutting of the protruding flexible circuit board by sharp edge of the baseplate when bent by an external force.

An embodiment of the present invention provides a peripheral device, including a manual operable device, a baseplate and a circuit board. The baseplate is configured for carrying the manual operable device; the baseplate includes a plate edge extending substantially along an x-axis, and a left plate indent edge, a left convex edge, a substantially linear edge, a right convex edge and a right plate indent edge are sequentially disposed on the plate edge. The circuit board includes a main portion and a flexible extension. The main portion is configured for generating a control signal in response to a triggering event at the manual operable device. The flexible extension extends substantially along a y-axis, and includes an upper end, a lower end, a y-axial left edge and a y-axial right edge; the upper end is connected to the main portion, the lower end is connected to an external connection point, and the control signal is transmitted to the external connection point via the flexible extension. The y-axial left edge intersects with the plate edge at the left plate indent edge, and the y-axial right edge intersects with the plate edge at the right plate indent edge. When the flexible extension receives a first external force and bends toward the baseplate along a plus direction of the x-axis, the left convex edge abuts against the flexible extension to avoid cutting of the y-axial left edge by the plate edge. When the flexible extension receives a second external force and bends toward the baseplate along a minus direction of the x-axis, the right convex edge abuts against the flexible extension to avoid cutting of the y-axial right edge by the plate edge.

The peripheral device according to the embodiments of the present invention utilizes the left and right convex edges disposed on the edge of the baseplate to abut against the flexible extension of the circuit board when the flexible extension is bent toward the baseplate along the plus or minus direction of the x-axis by a first or second external force, therefore avoiding cutting and damage of the flexible extension of the circuit board by the sharp edge of the baseplate during user operations.

For making the above and other purposes, features and benefits become more readily apparent to those ordinarily skilled in the art, the preferred embodiments and the detailed descriptions with accompanying drawings will be put forward in the following descriptions.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE INVENTION

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 3:
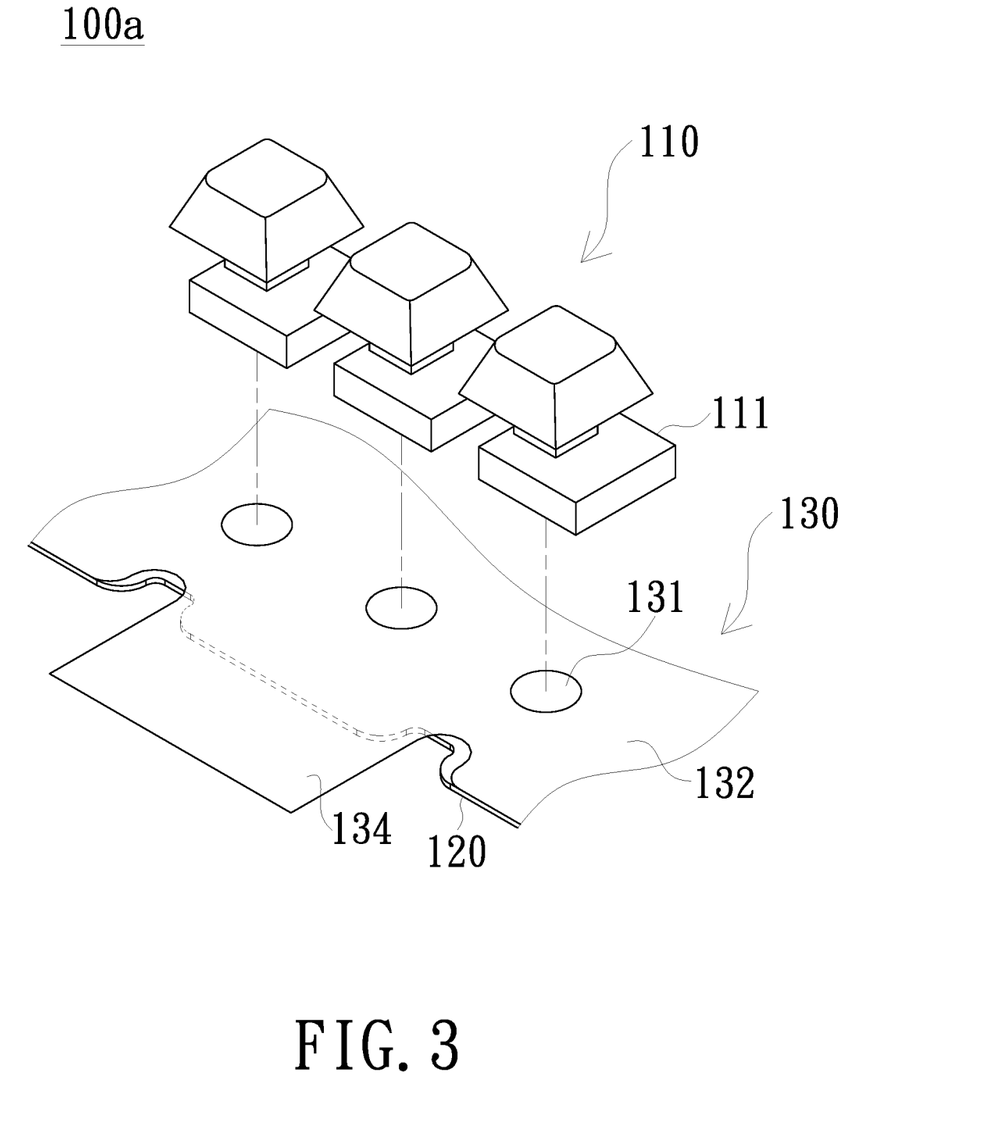
FIG. 3 is a schematic perspective view of the peripheral device according to an embodiment of the present invention.

Referring now to FIG. 3. As illustrated in FIG. 3, a peripheral device 100a according to the present embodiment includes a manual operable device 110, a baseplate 120 and a circuit board 130. The baseplate 120 carries the manual operable device 110 and the circuit board 130. The circuit board 130 includes a main portion 132 and a flexible extension 134. The main portion 132 may be disposed between the baseplate 120 and the manual operable device 110, and may generate a control signal in response to a triggering event at the manual operable device 110. The flexible extension 134 connects to the main portion 132 and protrudes over the baseplate 120. The flexible extension 134 may be adapted for electrically connecting the peripheral device 100a to an external component, such as a connector inside of a laptop (not shown in figures). In the present embodiment, the baseplate 120 may be, but is not limited to, a hard plate; for example, a hard metal plate.

The manual operable device 100 of the present embodiment may be a plurality of keycaps 111. The main portion 132 of the circuit board 130 may be a switch layer having a plurality of switches 131. The switches 131 are disposed corresponding to the keycaps, and thus may be triggered by vertical movements of the keycaps 111. Signals triggered by the switches 131 may be transmitted via the flexible extension 134 to an external component (not shown in figures) to activate corresponding instructions; however, the present invention is not limited thereto.

Figure 4:
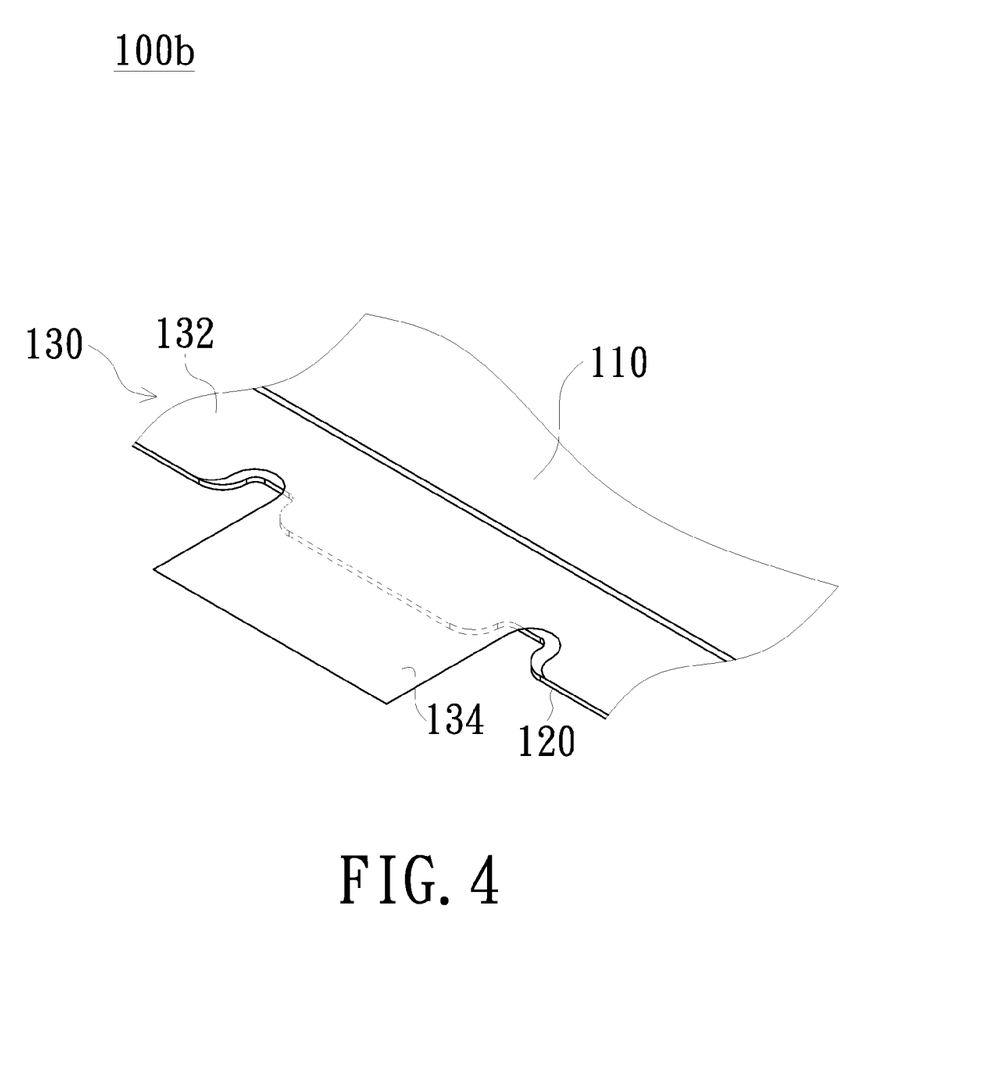
FIG. 4 is a schematic perspective view of the peripheral device according to another embodiment of the present invention.

Referring now to FIG. 4. As illustrated in FIG. 4, the manual operable device 110 of the peripheral device 100b of the present embodiment may be a touch plate. The main portion 132 of the circuit plate 130 may be a capacitor detection layer for generating control signals in response to gestures of the user on the touch plate (that is, the manual operable device 100). The control signals are then transmitted via the flexible extension 134 to an external component to activate corresponding instructions. It is to be understood that the present embodiment is merely exemplary and is not intended to limit the present invention.

Figure 5:
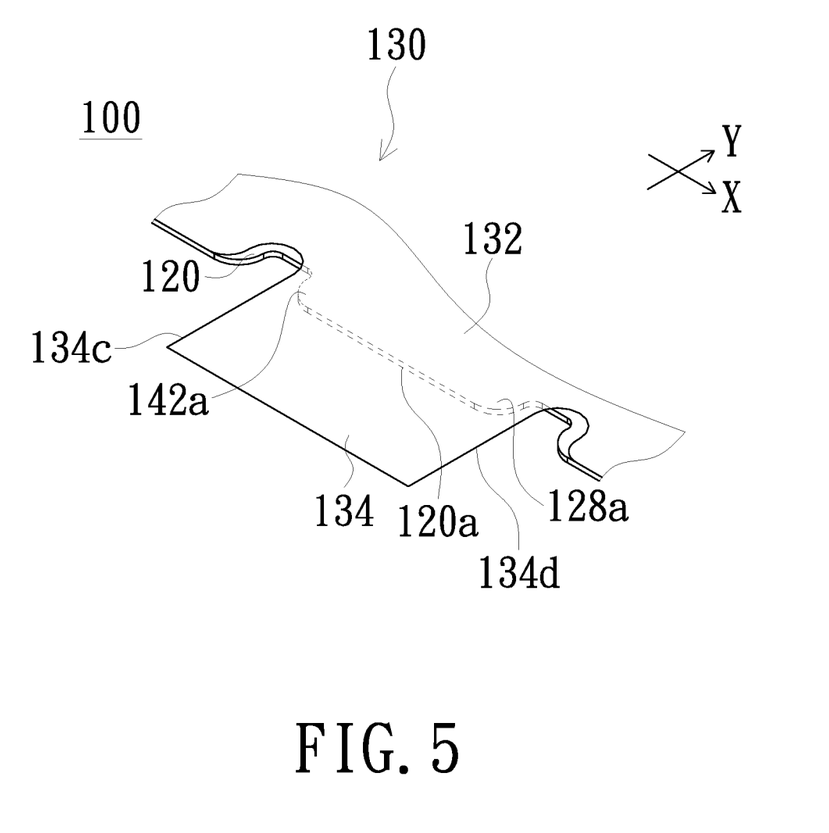
FIG. 5 is a schematic perspective view of the peripheral device according to another embodiment of the present invention without a manual operable device.
Figure 6:
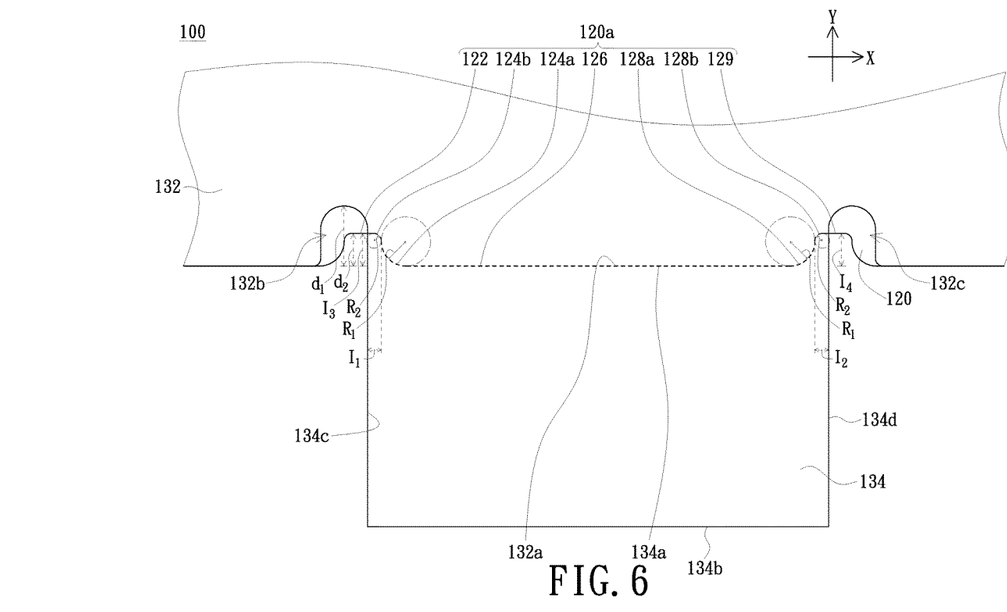
FIG. 6 is a schematic top view of the peripheral device according to another embodiment of the present invention without the manual operable device.

Referring to FIGS. 5, 6, 6A and 6B. As illustrated in FIGS. 5 and 6, the baseplate 120 of the peripheral device 100 of the present embodiment includes a plate edge 120a extending substantially along an x-axis. A left plate indent edge 122, a left concave edge 124b, a left convex edge 124a, a substantially linear edge 126, a right convex edge 128a, a right concave edge 128b and a right plate indent edge 129 are sequentially disposed on the plate edge 120a. However, the left concave edge 124b and the right concave edge 128b may be omitted.

The circuit board 130 disposed on the baseplate 120 includes the main portion 132 and the flexible extension 134. The flexible extension 134 extends substantially along a y-axis, and includes an upper end 134a, a lower end 134b, a y-axial left edge 134c and a y-axial right edge 134d. The upper end 134a of the flexible extension 134 is connected to the main portion 132, and the lower end 134b of the flexible extension 134 is connected to an external connection point. The control signal is transmitted to the external connection point via the flexible extension 134. It is to be understood that the external connection point may be a point of connection (eg. a connector) of the aforementioned external component connecting with the flexible extension 134. The y-axial left edge 134c may intersect with the plate edge 120a at the left plate indent edge 122, and the y-axial right edge 134d may intersect with the plate edge 120a at the right plate indent edge 129. It is to be understood that the angle between the x-axis and the y-axis of the present embodiment falls within the range of 70° to 110°; for example, the angle between the x- and y-axes may be, but is not limited to, 90°.

Figure 6A:
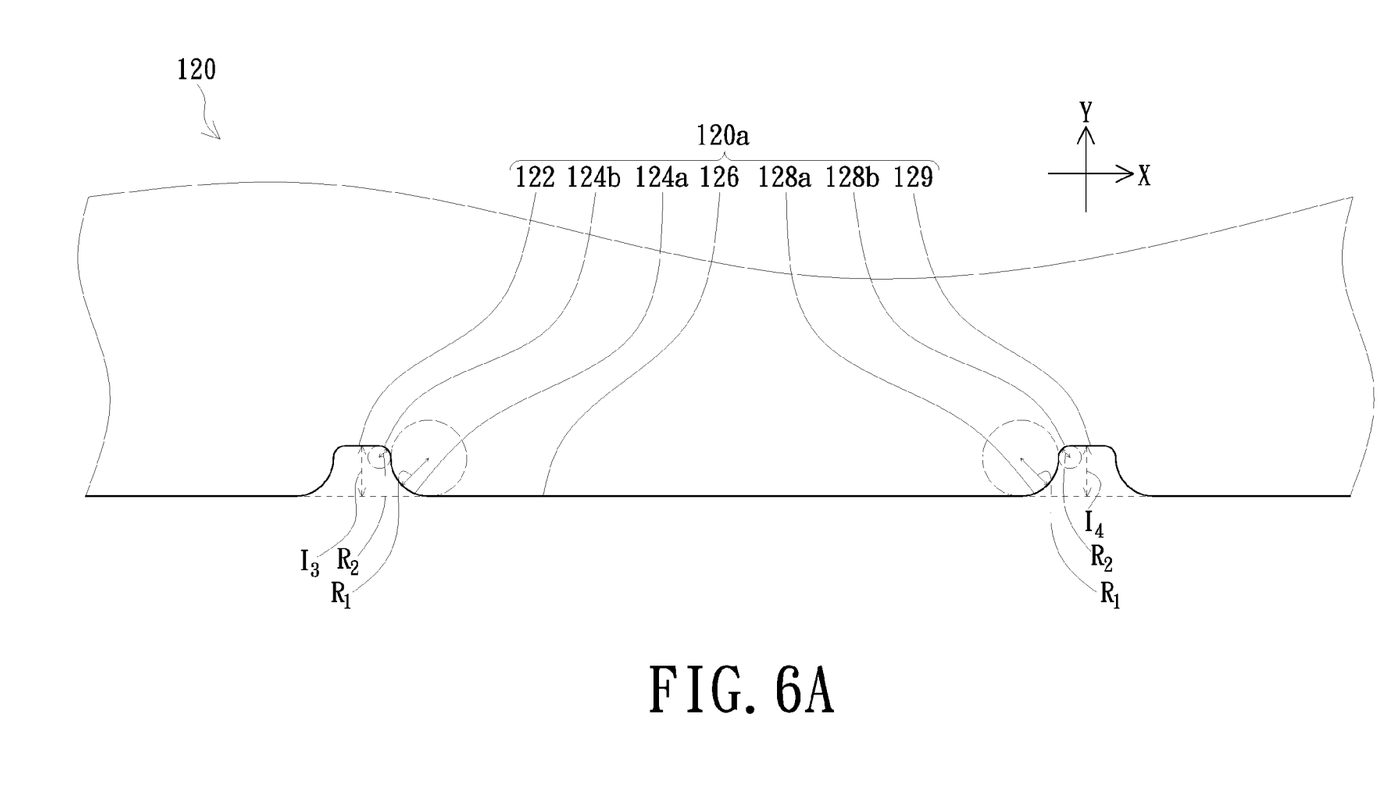
FIG. 6A is a schematic top view of a baseplate of the peripheral device of FIG. 5.
Figure 6B:
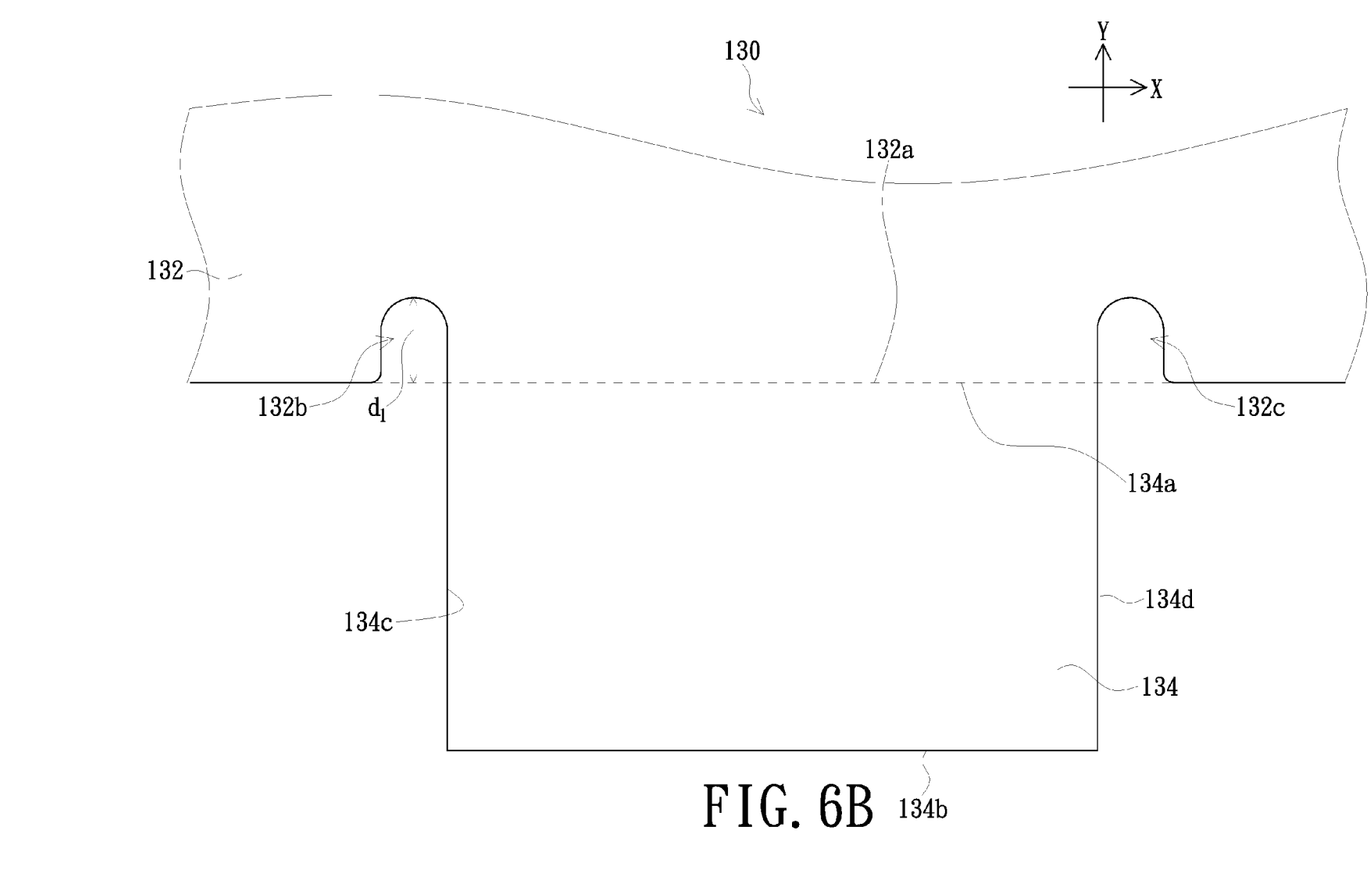
FIG. 6B is a perspective top view of a circuit board of the peripheral device of FIG. 5.

In other words, the main portion 132 and the flexible extension 134 may both be flexible circuit boards. The main portion 132 may include a main portion edge 132a, a left board indent edge 132b and a right board indent edge 132c. More specifically, the flexible extension 134 may extend from the board edge 132a; that is, the upper end 134a of the flexible extension 134 may align with the main portion edge 132a. The left board indent edge 132b is disposed between the main portion edge 132a and the y-axial left edge 134c of the flexible extension 134. Likewise, the right board indent edge 132c is disposed between the main portion edge 132a and the y-axial right edge 134d of the flexible extension 134.

Figure 7:
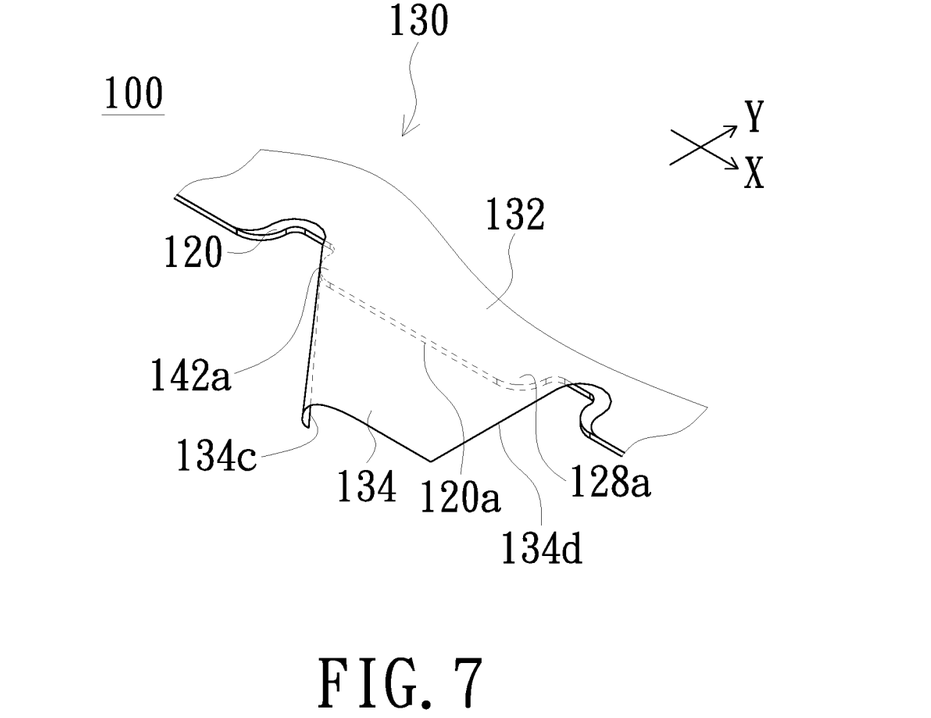
FIG. 7 is a schematic perspective view of the peripheral device of FIG. 5 without the manual operable device when being bent by an external force.

Referring now to FIG. 7. As illustrated in FIG. 7, when the flexible extension 134 receives a first external force and bends toward the baseplate 120 along the plus direction of the x-axis, the left convex edge 124a would abut against the flexible extension 134, therefore avoiding cutting of the y-axial left edge 134c of the flexible extension 134 by the sharp plate edge 120a. Likewise, when the flexible extension 134 receives a second external force and bends toward the baseplate 120 along the minus direction of the x-axis, the right convex edge 128a would abut against the flexible extension 134, therefore avoiding cutting of the y-axial right edge 134d by the plate edge 120a. Referring again to FIGS. 6, 6A and 6B. In this embodiment, the left convex edge 124a and the right convex edge 128a each has a first radius R1 falling within the range of 1.25 mm to 1.75 mm. For example, the first radius R1 may be, but is not limited to, 1.5 mm. Meanwhile, the plate edge 120a may further include the left concave edge 124b and the right concave edge 128b. The left convex edge 124a is disposed between the left concave edge 124b and the substantially linear edge 126, and the right convex edge 128a is disposed between the right concave edge 128b and the substantially linear edge 126. The left convex edge 124a and the right convex edge 128a each includes the first radius R1, and the left concave edge 124b and the right concave edge 128b each includes a second radius R2. The second radius R2 may be, but is not limited to, ⅓ in length of the first radius R1. For example, the first radius R1 is 1.5 mm and the second radius R2 is 0.5 mm; however, it is to be understood that the present invention is not limited thereto.

In the present embodiment, the shortest distance I1 between the left convex edge 124a and the y-axial left edge 134c may fall within the range of 0.5 mm to 0.6 mm. The shortest distance I2 between the right convex edge 128a and the y-axial right edge 134d may also fall within the range of 0.5 mm to 0.6 mm.

Furthermore, in the present embodiment, the left board indent edge 132b may depress along the y-axis for a first depth d1, and the left plate indent edge 122 may depress along the y-axis for a second depth d1. The first depth d1 may be, but is not limited to, greater than the second depth d2. Likewise, the right board indent edge 132c may also depress along the y-axis for the first depth d1, and the right plate indent edge 129 may depress along the y-axis for the second depth d1. The first depth dl may also be, but is not limited to, greater than the second depth d2.

In the present embodiment, the shortest distance 13 between the center of the left plate indent edge 122 and the virtual extended line of the substantially linear edge 126 may, but is not limited to, fall within the range of 1.4 mm to 1.6 mm. Likewise, the shortest distance 14 between the center of the right plate indent edge 129 and the virtual extended line of the substantially linear edge 126 may also, but is not limited to, fall within the range of 1.4 mm to 1.6 mm.

In sum, according to the aforementioned embodiments, the peripheral device of the present invention utilizes the left and right convex edges formed on the edge of the baseplate to abut against the flexible extension of the circuit board when the flexible extension is bent toward the baseplate along the plus or minus direction of the x-axis by a first or second external force, therefore avoiding cutting and damage of the flexible extension of the circuit board by the sharp edge of the baseplate during user operations.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A peripheral device, comprising:
a manual operable device;
a baseplate, configured for carrying the manual operable device, wherein the baseplate comprises a plate edge extending substantially along an x-axis, and a left plate indent edge, a left convex edge, a substantially linear edge, a right convex edge and a right plate indent edge are sequentially formed on the plate edge; and
a circuit board, comprising a main portion and a flexible extension, wherein the main portion is configured for generating a control signal, the flexible extension extends substantially along a y-axis, the flexible extension comprises an upper end, a lower end, a y-axial left edge and a y-axial right edge, the upper end is connected to the main portion, the lower end is connected to an external connection point, the control signal is transmitted to the external connection point via the flexible extension,
wherein the y-axial left edge intersects with the plate edge at the left plate indent edge, the y-axial right edge intersects with the plate edge at the right plate indent edge,
when the flexible extension receives a first external force and bends toward the baseplate along a plus direction of the x-axis, the left convex edge abuts against the flexible extension to avoid cutting of the y-axial left edge by the plate edge,
when the flexible extension receives a second external force and bends toward the baseplate along a minus direction of the x-axis, the right convex edge abuts against the flexible extension to avoid cutting of the y-axial right edge by the plate edge.

2. The peripheral device according to claim 1, wherein at least one of the left convex edge and the right convex edge comprises a first radius falling within a range of 1.25 mm to 1.75 mm.

3. The peripheral device according to claim 1, wherein the plate edge further comprises a left concave edge, the left convex edge is disposed between the left concave edge and the substantially linear edge.

4. The peripheral device according to claim 3, wherein the left convex edge comprises a first radius, the left concave edge comprises a second radius, and the second radius is ⅓ in length of the first radius.

5. The peripheral device according to claim 1, wherein a shortest distance between the left convex edge and the y-axial left edge falls within a range of 0.5 mm to 0.6 mm.

6. The peripheral device according to claim 1, wherein a shortest distance between a center of the left plate indent edge and a virtual extended line of the substantially linear edge falls within a range of 1.4 mm to 1.6 mm.

7. The peripheral device according to claim 1, wherein the plate edge further comprises a right concave edge, the right convex edge is disposed between the right concave edge and the substantially linear edge.

8. The peripheral device according to claim 3, wherein the right convex edge comprises a first radius, the right concave edge comprises a second radius, and the second radius is ⅓ in length of the first radius.

9. The peripheral device according to claim 1, wherein a shortest distance between a center of the right plate indent edge and a virtual extended line of the substantially linear edge falls within a range of 1.4 mm to 1.6 mm.

10. The peripheral device according to claim 1, wherein the control signal is generated in response to a triggering event received at the manual operable device.

11. The peripheral device according to claim 10, wherein the manual operable device is a plurality of keycaps, the main portion of the circuit board is a switch layer having a plurality of switches, the plurality of switches are disposed corresponding to the plurality of keycaps and are triggered by vertical movements of the plurality of keycaps.

12. The peripheral device according to claim 10, wherein the manual operable device is a touch plate, the main portion of the circuit plate is a capacitor detection layer for generating the control signal in response to a gesture of a user on the touch plate.

13. The peripheral device according to claim 1, wherein the main portion and the flexible extension are flexible circuit boards, the main portion further comprises a main portion edge and a left board indent edge, the flexible extension extends from the board edge, the left board indent edge is disposed between the main portion edge and the y-axial left edge.

14. The peripheral device according to claim 9, wherein the left board indent edge depresses along the y-axis for a first depth, the left plate indent edge depresses along the y-axis for a second depth, and the first depth is greater than the second depth.

15. The peripheral device according to claim 1, wherein the main portion and the flexible extension are flexible circuit boards, the main portion further comprises a main portion edge and a right board indent edge, the flexible extension extends from the board edge, the right board indent edge is disposed between the main portion edge and the y-axial right edge.

16. The peripheral device according to claim 9, wherein the right board indent edge depresses along the y-axis for a first depth, the right plate indent edge depresses along the y-axis for a second depth, and the first depth is greater than the second depth.

17. The peripheral device according to claim 1, wherein an angle between the x-axis and the y-axis falls within a range of 70° to 110°.

18. A peripheral device, comprising:
a manual operable device;
a baseplate, configured for carrying the manual operable device, wherein the baseplate comprises a plate edge extending substantially along an x-axis, and a left plate indent edge, a left convex edge, a substantially linear edge, a right convex edge and a right plate indent edge are sequentially formed on the plate edge; and
a circuit board, comprising a main portion and a flexible extension, the flexible extension comprises an upper end, a lower end, a y-axial left edge and a y-axial right edge, the upper end is connected to the main portion, the flexible extension extends substantially along a y-axis and across the plate edge, the main portion and the upper end are overlapped with the baseplate, the lower end extends outside the plate edge;

wherein the y-axial left edge intersects with the plate edge at the left plate indent edge, the y-axial right edge intersects with the plate edge at the right plate indent edge, when the flexible extension receives a first external force and bends toward the baseplate along a plus direction of the x-axis, the left convex edge abuts against the flexible extension to avoid cutting of the y-axial left edge by the plate edge, when the flexible extension receives a second external force and bends toward the baseplate along a minus direction of the x-axis, the right convex edge abuts against the flexible extension to avoid cutting of the y-axial right edge by the plate edge.

* * * * *